United States Patent
Nishiyama

(10) Patent No.: US 7,539,695 B2
(45) Date of Patent: May 26, 2009

(54) POINTER COMPRESSION/EXPANSION METHOD, A PROGRAM TO EXECUTE THE METHOD AND A COMPUTER SYSTEM USING THE PROGRAM

(75) Inventor: Hiroyasu Nishiyama, Kawasaki (JP)

(73) Assignee: Hitachi Ltd., Tokyo (JP)

( * ) Notice: Subject to any disclaimer, the term of this patent is extended or adjusted under 35 U.S.C. 154(b) by 307 days.

(21) Appl. No.: 11/709,297

(22) Filed: Feb. 22, 2007

(65) Prior Publication Data
US 2007/0276794 A1    Nov. 29, 2007

(30) Foreign Application Priority Data
Feb. 24, 2006   (JP)   .............. 2006-047665

(51) Int. Cl.
*G06F 7/00*   (2006.01)
*G06F 17/00*  (2006.01)

(52) U.S. Cl. ...................... 707/101; 707/102

(58) Field of Classification Search ......... 707/100–102, 707/103 R, 205
See application file for complete search history.

(56) References Cited

U.S. PATENT DOCUMENTS

| | | | | |
|---|---|---|---|---|
| 5,321,701 A | * | 6/1994 | Raymond et al. | 714/736 |
| 5,379,036 A | * | 1/1995 | Storer | 341/51 |
| 5,406,279 A | * | 4/1995 | Anderson et al. | 341/51 |
| 6,204,796 B1 | * | 3/2001 | Chan et al. | 341/176 |
| 6,580,707 B1 | * | 6/2003 | Ikeda et al. | 370/351 |
| 7,305,383 B1 | * | 12/2007 | Kubesh et al. | 707/3 |
| 2002/0010702 A1 | * | 1/2002 | Ajtai et al. | 707/101 |
| 2002/0091886 A1 | * | 7/2002 | Meulenbroeks | 710/100 |
| 2006/0288024 A1 | * | 12/2006 | Braica | 707/101 |

OTHER PUBLICATIONS

Adl-Tabatabai, A., et al. "Improving 64-Bit Java Performance by Compressing Heap References" Proceedings of the Internatinal Symposium on Code Generation and Optimization, 2004.

* cited by examiner

*Primary Examiner*—Don Wong
*Assistant Examiner*—Merilyn P Nguyen
(74) *Attorney, Agent, or Firm*—McDermott Will & Emery LLP

(57) ABSTRACT

A pointer field compression/expansion method is provided for a computer system having a data structure reference function using a pointer. The pointers in data structure which a program refers to are classified into pointers to be frequently referred to and those not to be frequently referred to. The pointers not to be frequently referred to are determined as targets of compression and expansion to thereby reduce and suppress the overhead required for the pointer compression and expansion. Information indicating whether or not a pointer in data structure is a compression target is provided separately or such identifying information is embedded into in the pointer whereby the compressed or uncompressed format of the pointer can be dynamically determined.

9 Claims, 14 Drawing Sheets

```
tmp = LOAD addr
if(tmp == 0)
    ptr = 0;          ~401
else
    ptr = base+tmp
```
LOAD SEQUENCE

```
if(ptr == 0)
    tmp = 0;          ~402
else
    tmp = ptr-tmp
STORE addr = tmp
```
STORE SEQUENCE

FIG.5A PRIOR ART
```
class Tree {
    Tree left;         ~501
    Tree right;
    String name;
    Number value;
}
```
OBJECT DEFINITION EXAMPLE
FIG.5B PRIOR ART
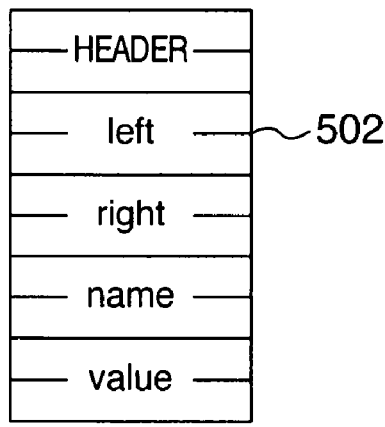
OBJECT STRUCTURE IN UNCOMPRESSED FORMAT
FIG.5C PRIOR ART
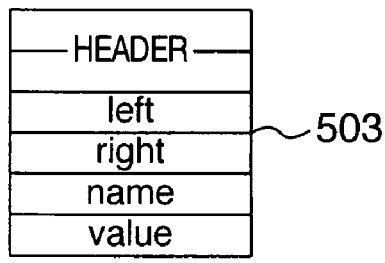
OBJECT STRUCTURE IN COMPRESSED FORMAT

| CLASS NAME | FIELD NAME | REFERENCE FREQUENCY |
|---|---|---|
| Tree | right | 20.0% |
| Tree | left | 17.2% |
| ... | ... | ... |
| Tree | value | 0.2% |
| Tree | name | 0.1% |

601 — CLASS NAME
602 — FIELD NAME
603 — REFERENCE FREQUENCY

701 — HEADER
702 — left
703 — right
704 — name
705 — value

```
@Frequent("left, right")
class Tree {
    Tree left;
    Tree right;            ~1901
    String name;
    Number value;
}
```

POINTER COMPRESSION/EXPANSION METHOD, A PROGRAM TO EXECUTE THE METHOD AND A COMPUTER SYSTEM USING THE PROGRAM

INCORPORATION BY REFERENCE

The present application claims priority from Japanese application JP2006-047665 filed on Feb. 24, 2006, the content of which is hereby incorporated by reference into this application.

BACKGROUND OF THE INVENTION

The present invention relates to a storage technique for pointers in data structure of a program, and in particular, to a technique to reduce the overhead in compression and expansion of pointers and to downsize the data structure.

To easily handle large-sized data including programs, some of the recent microprocessors support a 64-bit address space.

By expanding the number of address bits from 32 to 64, the maximum memory space which a program can refer to increases from four GigaBytes (GB; ten to the ninth power bytes) to 16 ExaBytes (EB; ten to the 18th power bytes). However, general users require a memory space less than several gigabytes in many cases. The 32-bit address space is sufficient for most computer systems today.

A pointer to designate a 64-bit address is larger in size than a pointer for a 32-bit address. That is, for one and the same data structure to be treated by a program, the ratio of an area occupied by the pointers in the memory is larger for the 64-bit processor than the 32-bit processor.

In object-oriented programs such as Java programs, pointers frequently appear in data structure called "object". Therefore, the expansion of the pointers exerts a considerable influence upon such programs. Since the memory is finite, there possibly occurs a case in which part of the data structure including pointers cannot be fully stored in the memory.

When compared with conventional programming languages such as FORTRAN having a tendency to repeatedly use simple data structure, the languages such as Java are deteriorated in the utilization efficiency of the cache memory. Description will next be given of the utilization efficiency.

To refer to the main memory, a general microprocessor requires a long period of time corresponding to several hundred of cycles. To avoid this disadvantageous operation, there is disposed between the main memory and registers a cache memory which is a small-sized memory which can be accessed at a high speed. The processor includes a function to keep a copy of accessed data in the cache. If the cache contains data equal to data to be referred to, the processor can refer to the data in the cache at a high speed. However, the capacity of the cache is finite. If the amount of data increases, the number of data items storable in the cache becomes smaller.

To cope with the difficulty, there has been proposed a method for use with a program using the Java language of compressing pointer representations in an object allocated in a heap memory of Java in an article "A. Adl-Tabatabai, J. Bharadwaj, M. Cierniak, M. Eng, J. Fang, B. Lewis, B. Murphy, and J. Stichnoth, Improving 64-Bit Java IPF Performance by Compressing Heap References, In Proceedings of the International Symposium on Code Generation and Optimization, 2004". According to the method described in the article, a pointer designating an object secured in the Java heap memory is expressed using a base address indicating a first address of the heap memory and an offset value relative to the base address.

FIG. 3 shows a layout of such memory space. In a memory space 301 using 64-bit addresses, a heap memory 302 includes successive addresses beginning at a base address 304 indicated by a variable "base". An object is placed in the heap memory 302. The base address 304 is fixed. Assume that the maximum value of the heap memory address is limited to four gigabytes corresponding to the maximum value representable by 32 bits. When the pointer indicating an object in the heap memory is specified by the offset 305 relative to the base address 304, the pointer can be expressed in the form in which the address is compressed to 32 bits.

In this connection, for example, if the object allocation address is a multiple of eight, a larger heap memory area can be handled, for example, by setting a multiple of eight to the offset value. As above, the size of the data structure including pointers can be reduced by compressing the number of bits allocated to pointers from 64 to 32. This results in increase in the number of data items storable in the cache memory as above, which hence improves the cache hit ratio.

To actually refer to data in an object A, a pointer value in a uncompressed format is required. Therefore, when a computer system makes reference to or refers to an object indicated by a pointer defined in the compressed format, it is necessary to convert the pointer expression from the compressed format into the uncompressed format. Conversely, to store a pointer value in the uncompressed format, the pointer is required to be converted from the uncompressed format into the compressed format.

The conversion from the compressed format into the uncompressed format is carried out by adding the base address to the pointer value in the compressed format. The conversion from the uncompressed format into the compressed format is conducted by subtracting the base address from the address of the object in the uncompressed format. However, attention is to be given to a particular value called "null" which is prepared as a pointer value not specifying any valid data in most programming languages including Java. As shown in FIG. 3, the value of a null 306 is set to "0" in general. When the address of an object 303 is expressed by an offset 305 relative to a base address 304, the null value cannot be expressed without modification. It is therefore necessary to treat a situation in which the pointer value is "null", as a special case.

FIGS. 4A and 4B show conventional examples of pointer compression and expansion sequences. That is, FIGS. 4A and 4B show pseudo codes representing load and store processing sequences for pointers in the compressed format in which attention has been given to the null described above. To load a pointer in the compressed format, a check is made to determine whether or not the loaded value is "0" (value of the null). If the value is "0", the pointer value is corrected (401). Similarly, in the store sequence using a pointer in the compressed format, a check is made to determine the value of the target of "store". If the value is "0", the pointer value is corrected (402).

FIGS. 5A and 5B show examples of effect of the pointer compression in the prior art.

A numeral 501 indicates an example of an object definition as a target of pointer compression. It is assumed in the object definition that "left", "right", "name", and "value" are pointers to indicate respective objects. It is assumed that the header to store items such as an attribute of the object occupies two words. In a situation in which a 64-bit processor employs the pointer in the uncompressed format, the target object occupies a memory area of ten words as indicated by a numeral 502. On the other hand, if the pointer is expressed in the compressed format, the object occupies an area of six words as indicated by a numeral 503. That is, four words are saved in the memory use.

SUMMARY OF THE INVENTION

The conventional pointer compression method requires conversions between the pointers respectively of the uncompressed and compressed formats. Therefore, if a pointer which a program frequently refers to is compressed, the overhead of the conversion is more influential than the improvement in the cache hit rate due to the compression. This possibly results in the deterioration in performance.

It is therefore an object of the present invention to remove the problem described below.

By analyzing operations of a program to refer to pointers, the pointers are classified into pointers with a high access frequency and those with a lower access frequency. The pointers with a high access frequency is represented in the uncompressed format, and those with a lower access frequency are represented in the compressed format. There is disposed a scheme to discriminate the pointers in the compressed format from those in the uncompressed format. According to the scheme, the discrimination is conducted using a table for each field to which the pointer belongs or using a value stored in the pointer itself.

While reducing or suppressing the overhead required for the conversion between the compressed format and the uncompressed format of the pointer which the program refers to, the memory area occupied by the data structure is reduced by use of the pointers in the compressed format. This advantageously improves the cache hit rate and performance of the computer system (in the program execution).

Other objects, features and advantages of the invention will become apparent from the following description of the embodiments of the invention taken in conjunction with the accompanying drawings.

BRIEF DESCRIPTION OF THE DRAWINGS

FIG. 5A is a diagram showing an example of an object definition.

FIG. 5B is a diagram showing structure of an object in the uncompressed format.

FIG. 5C is a diagram showing structure of an object in the compressed format.

DESCRIPTION OF THE EMBODIMENTS

Description will now be given of embodiments of the present invention.

First Embodiment

Figure 2:
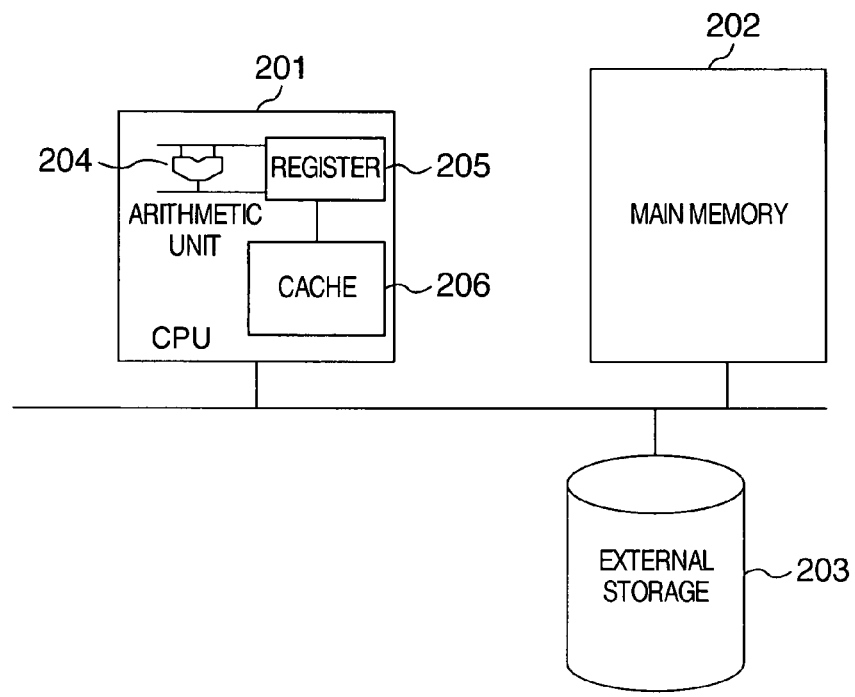
FIG. 2 is a block diagram showing an outline of structure of a computer system as a target of application of the present invention.
Figures 3, 4A, 4B:
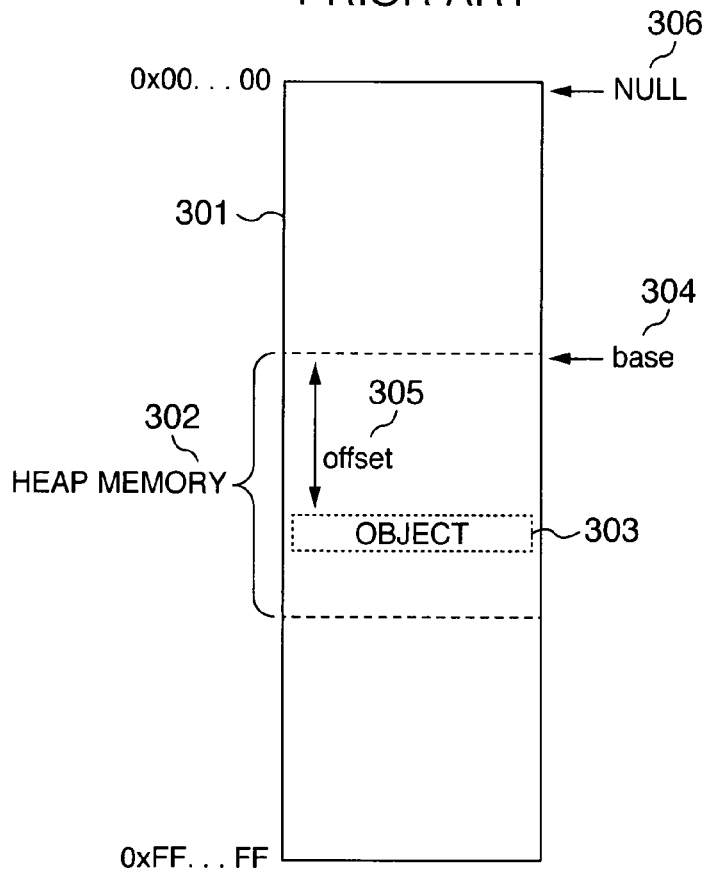
FIG. 3 is a diagram showing a layout of a memory space.
FIG. 4A is a diagram showing an example of a load sequence in a pointer expansion sequence.
FIG. 4B is a diagram showing an example of a store sequence in a pointer compression sequence.

FIG. 2 shows an outline of the configuration of a computer system to which the present invention is applied.

Programs and data of a language processing system to which the present invention is applied are stored in an external storage 203. The language processing system is executed by a Central Processing Unit (CPU) 201 as follows. The CPU reads a program of the system from the storage 203 to load the program in a main memory 202 and then executes the program in the memory.

To access the memory 202 at a high speed, the CPU 201 includes a small-sized and high-speed cache memory 206. To execute calculation processing, the CPU 201 loads data in a register 205 and conducts an arithmetic operation for the data by use of an arithmetic unit 204. To load data in the register 205, the CPU 201 makes a check to determine whether or not the data exists in the cache memory 206. If the data exists therein, the CPU 201 uses the data. Otherwise, the CPU 201 reads the data from the main memory 202 to load the data in the register 205 and stores the data also in the cache 206.

Figure 1:
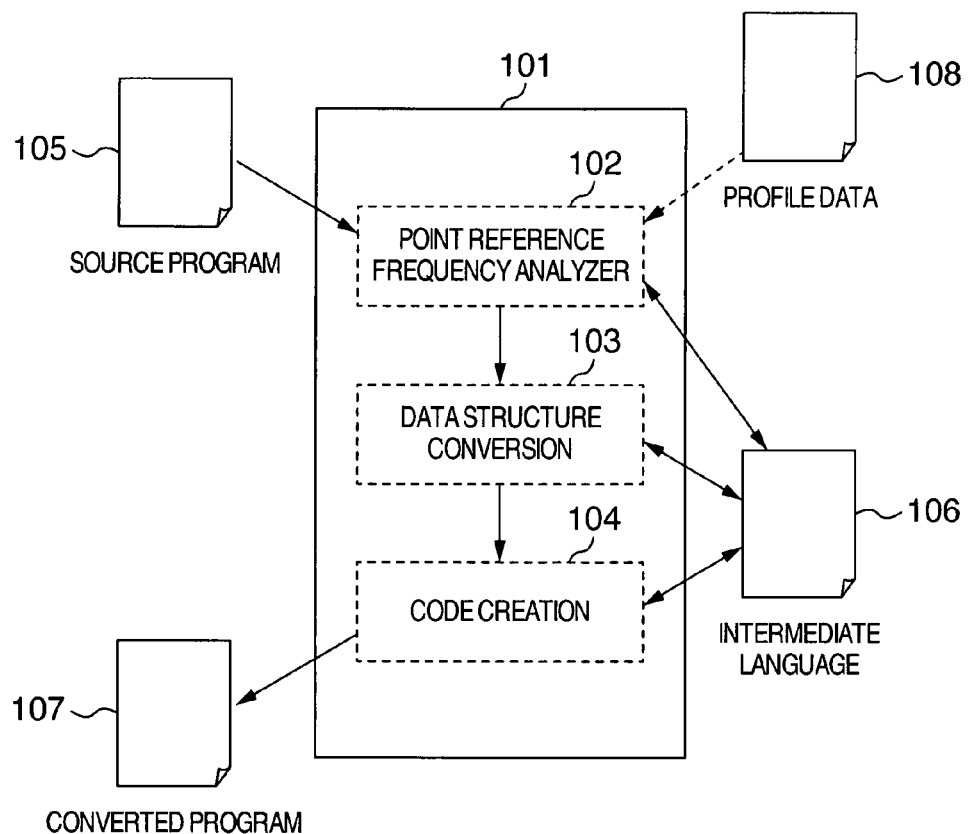
FIG. 1 is a block diagram showing a configuration of a language processing system according to the present invention.

FIG. 1 shows an embodiment according to the present invention.

A language processing system 101 according to the present invention receives as an input thereto a source program 105 and then produces a converted program 107 using the source program 105. The system 101 includes a pointer reference frequency analyzer 102, a data structure converter 103, and a code generator section 104. Each of the constituent components of the system 101 refers to an intermediate language 106. Depending on embodying modes, the analyzer 102 refers to profile data 108 regarding the pointer reference frequency.

Figures 6, 7:
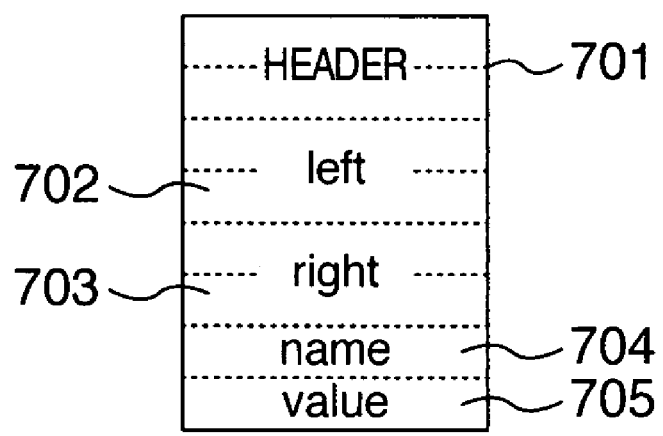
FIG. 6 is a diagram showing an example of profile data 108 of a reference frequency.
FIG. 7 is a diagram showing an example of object structure including pointers of compressed and uncompressed formats.

FIG. 6 shows an example of the profile data 108 regarding the reference frequency of pointers in the object shown in FIGS. 5A to 5C.

In the profile data 108 (FIG. 1), each entry includes three fields, i.e., a class name 601, a field name 602, and a reference frequency 603. It is assumed in this connection that a ratio of the reference count of each field to the total reference count of all fields in the program is referred to as a reference frequency. As can be seen from the example of FIG. 6, "right" and "left" have a higher reference frequency and "value" and "name" have a lower frequency. Therefore, by setting "right" and "left" as uncompressed items and "value" and "name" as compressed items, the memory area used by the pointers becomes smaller while reducing the overhead of conversions between compressed and uncompressed formats in operations to refer to pointers. FIG. 7 shows a result of the operation described above.

In the object structure including the pointers of compressed and uncompressed formats shown in FIG. 7, a header to store an attribute of an object occupies two words, each of the fields "left" and "right" is in the uncompressed format (two words), and each of the fields "name" and "value" is in the compressed format (one word). As a result, the object size is reduced to eight words, and the conversion overhead is also reduced in the operations to refer to "left" and "right".

Referring now to the flowcharts shown in FIGS. 8 to 10, description will be given of processing in the language processing system 101 of FIG. 1.

Figure 8:
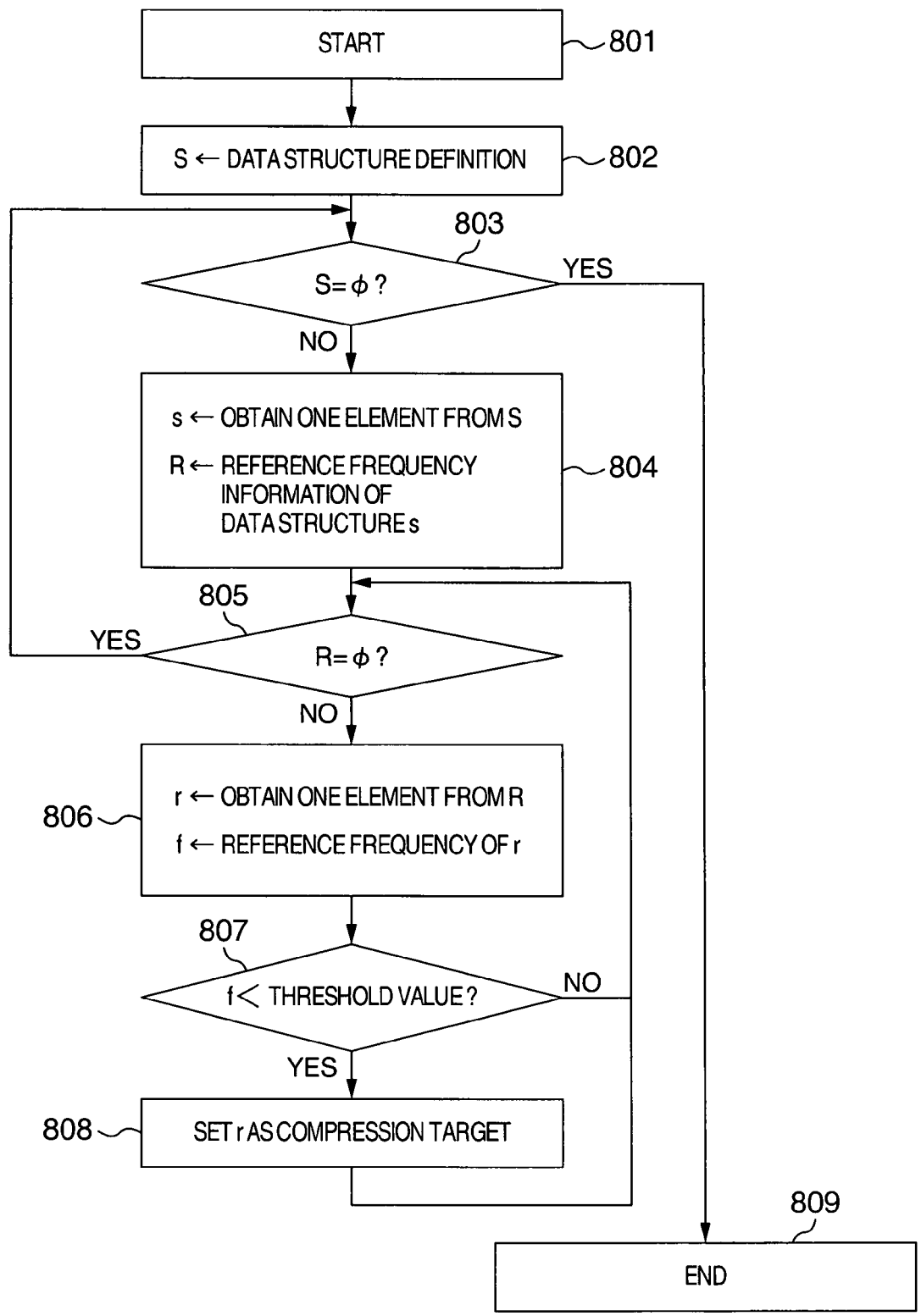
FIG. 8 is a flowchart for a pointer reference frequency analyzer 102.

FIG. 8 shows an embodiment of a processing flow for the pointer reference frequency analyzer 102. In the processing, by referring to the profile data 108, it is determined whether or not a field reference is associated with a compression target. The processing is started at step 801. In step 802, a set of data structure defined in the program is represented as variable S. Control is then passed to judge step 803 to confirm whether or not variable S is an empty set. If variable S is an empty set, there does not exist a data structure definition to be processed, and hence control goes to step 809 to terminate the processing.

If variable S is other than an empty set, control is passed to step 804 in which one of the data structure definitions is obtained from variable S and is stored in variable s. It is also assumed that a set of information of the reference frequency of each field in the data structure definitions is represented as variable R. A set of the reference frequency information of each field, for example, the field name 602 (FIG. 6) can be obtained by finding entries of the same data structure from the profile data 108 of FIG. 1. It is required to produce the profile data 108 by executing an associated program in advance.

Subsequently, whether or not variable R is an empty set is confirmed in judge step 805. If variable R is an empty set, there does not exist a field to be processed. Control goes to step 803 to process next data structure. If variable R is other than an empty set, control goes to step 806. One element is obtained from variable R, i.e., the set of reference frequency information, and the element is stored in variable r. Thereafter, a reference frequency corresponding to the field name represented by variable r including reference frequency information is stored in variable f.

Next, a check is made in judge step 807 to determine whether or not the value of f is less than a predetermined threshold value. If the value is less than the threshold value (yes in step 807), it is assumed that the pointer has a low reference frequency, and the value of the pointer corresponding to r is designated as a compression target (step 808). Control returns to judge step 805 to process next reference frequency information. If the value is equal to or more than the threshold value (no in step 807), the value of the pointer corresponding to r is not designated as a compression target. Control returns to judge step 805 to process next reference frequency information.

As a result of the processing described above, it is possible to select as compression targets only the values of pointers with a lower reference frequency. In this regard, for a pointer, information indicating whether or not the pointer is a compression target is stored in the intermediate language 106 or as information associated with the intermediate language 106.

Figure 9:
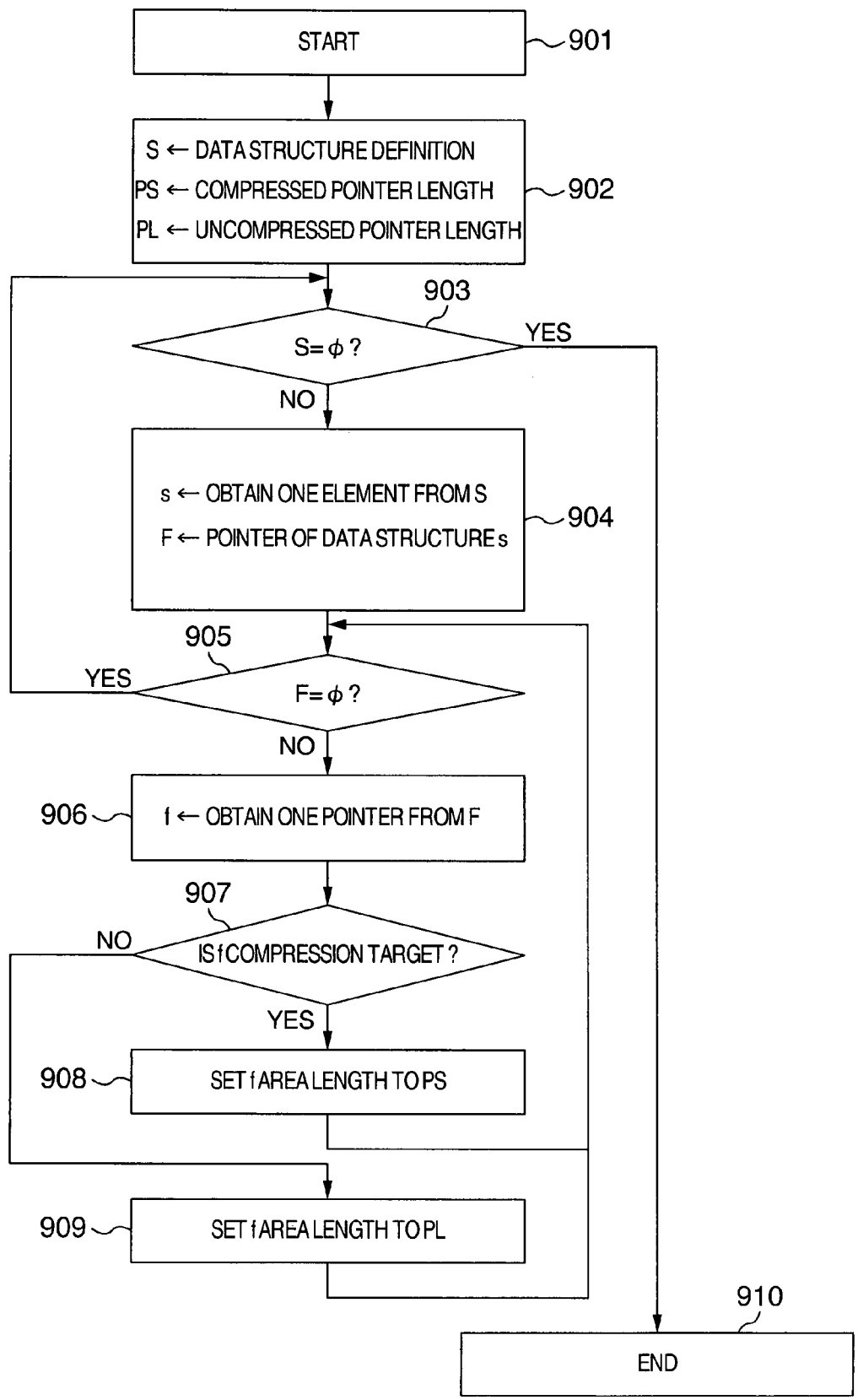
FIG. 9 is a flowchart for a data structure conversion processing section 103.

The flowchart of FIG. 9 shows an embodiment of a processing flow for the data structure converter section 103 of FIG. 1. The converter section 103 obtains, according to the result produced from the pointer reference frequency analyzer 102, an area length occupied by each pointer defined in the data structure specified in the program. The analyzer 102 refers to the profile data 108 to obtain, as an area length of each field (FIG. 6), a field length before compression for a field not to be compressed and a field length after compression for a field to be compressed. The field layout in the data structure is determined by accumulating the each field size. For a language allowing that the fields may be ordered in the object in a sequence other than a sequence declared in advance, the memory area can be more efficiently used by re-ordering the fields after the field lengths are calculated.

The data structure converter section 103 (FIG. 1) starts its processing in step 901. In step 902, a set of data structure definitions in the program are represented as variable S, the size of a pointer in the compressed format in the memory is represented as variable PS, and the size of a pointer in the uncompressed format in the memory is represented as variable PL. Control goes to step 903 to determine whether or not variable S is an empty set. If variable S is an empty set, there does not exist data structure to be processed, and hence control goes to step 910 to terminate the processing.

If variable S is other than an empty set, control goes to step 904. One element representing a data structure definition is obtained from variable S and is stored in variable s. A set of pointer fields defined in variable s is represented as variable F. Control goes to step 905 to determine whether or not variable F is an empty set. If variable F is an empty set, there does not exist a pointer field to be processed. Control hence goes to step 903 to process a next data structure definition. If variable F is other than an empty set, control goes to step 906. One of the pointer fields is obtained from variable F and is stored in variable f. Whether or not the field f is determined as a compression target by the pointer reference frequency analyzer 102 is confirmed by judge step 907. If the field f is a compression target, the area length of the field f is set as PS in step 908; otherwise, the field f is set as PL in step 909.

Control goes to step 905 to continuously process a next field. Through the processing described above, an area occupied by the pointer fields is determined when a memory area is allocated to the data structure.

Figure 10:
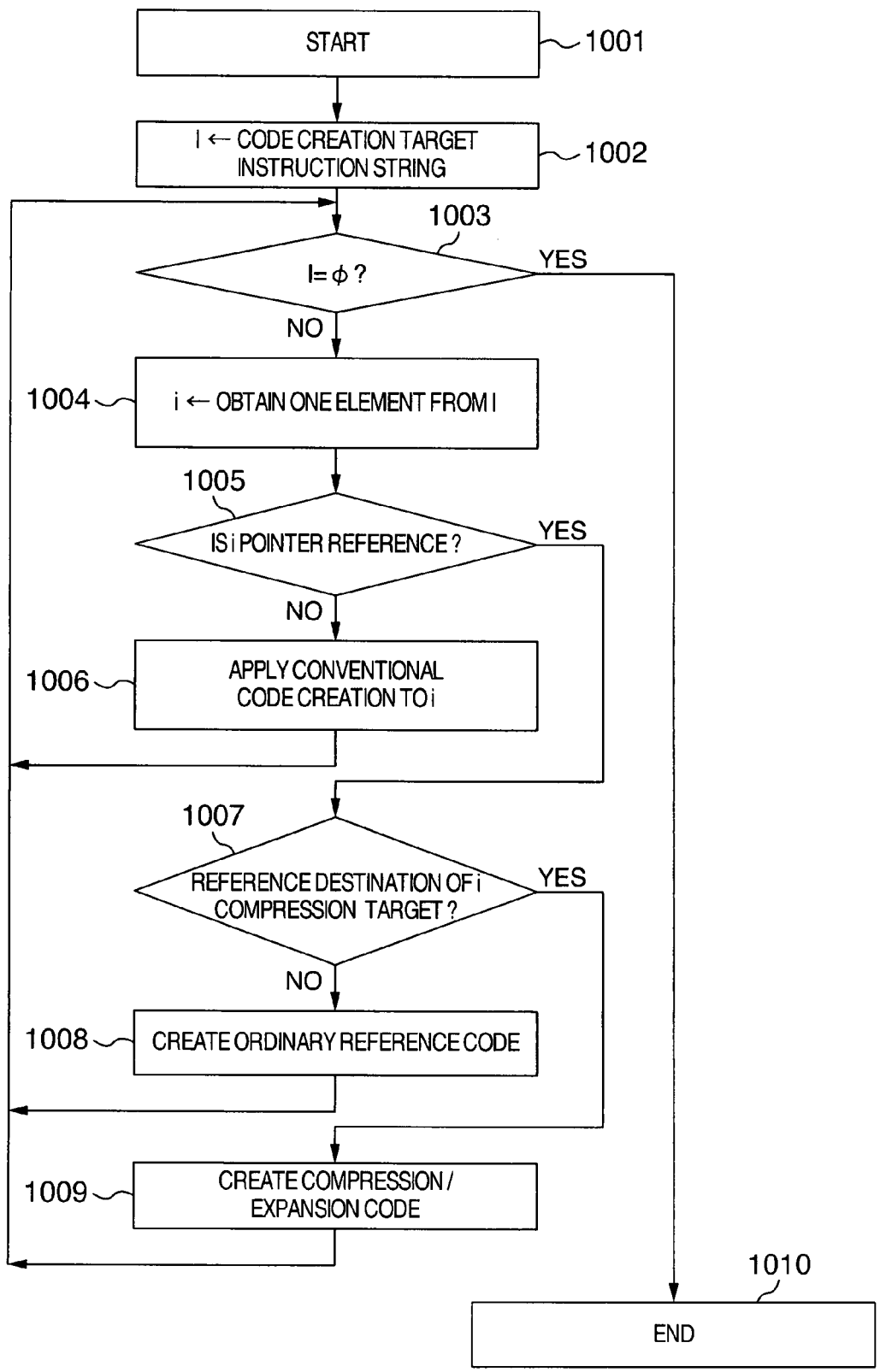
FIG. 10 is a flowchart for a code generation processing section 104.

The flowchart of FIG. 10 shows an embodiment of the code generator section 104 of FIG. 1.

The code generator section 104 starts its processing in step 1001. In step 1002, a string of code creation target instructions is set as variable I. In step 1003, a check is made to determine if variable I is an empty set. If variable I is an empty set, there does not exist an instruction to be processed. Control goes to step 1010 to terminate the processing. If variable I is other than an empty set, control goes to step 1004. One of the elements is obtained from variable I and is stored in variable i.

In step 1005, a check is made to determine whether or not variable i is an instruction which refers to a pointer field. If variable i is other than a pointer field reference instruction which refers to a pointer field, the conventional instruction generation processing is applied to variable i in step 1006. Control goes to step 1003 to process a next instruction. If variable i is a pointer field reference instruction in step 1005, control goes to step 1007 to determine whether or not the pointer field or the reference destination to be referred to by variable i is a compression target. If the reference destination of variable i is other than a compression target, an ordinary pointer reference code is generated in step 1008. Otherwise, a pointer reference code including the compression and expansion processing is generated in step 1009.

Control goes to step 1003 to process a next instruction. As a result of the above processing in which the pointers are classified into pointers of compressed format and those of uncompressed format and fields with a higher reference frequency are expressed in the uncompressed format, the pointer reference overhead as well as the total amount of data can be reduced.

Second Embodiment

Figure 11:
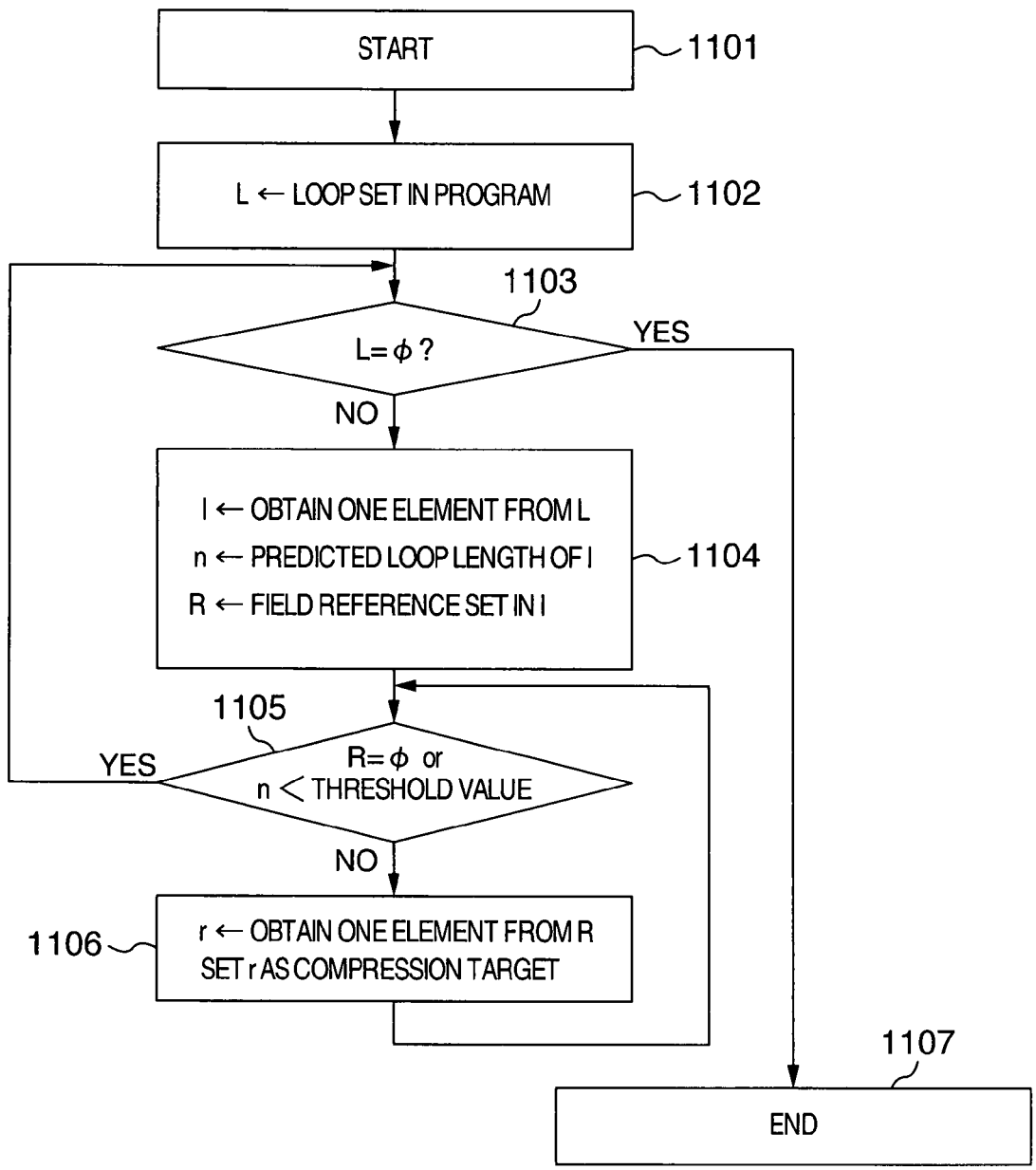
FIG. 11 is a flowchart of a program analysis by a pointer reference analyzer 102

The prediction processing of the first embodiment to predict the field reference frequency in the program by use of the profile data 108 (FIG. 1) may also be achieved through a program analysis without using the profile data 108. The flowchart of FIG. 11 shows an embodiment of processing to implement the pointer reference frequency analyzer 102 of FIG. 1 by using a program analysis.

The processing starts in judge step 1101. In step 1102, a set of loops in the program is represented as variable L. In judge step 1103, a check is made to determine whether or not variable L is an empty set. If variable L is an empty set, there does not exist a loop to be processed, and hence control goes to step 1107 to terminate the processing. If variable L is other than an empty set, control goes to step 1104 in which one element is obtained from the loop set L and is represented as variable l. A predicted loop length of variable l is represented as variable n, and a set of field references in variable l is represented as variable R.

Next, in judge step 1105, a check is made to determine whether or not variable R (field reference set) is an empty set or variable n (predicted loop length) is less than a threshold value. If variable R is an empty set or variable n is less than the threshold value, variable l (one element of the loop set L) does not include a field reference as a compression target. Control goes to step 1103 to process next variable L.

If variable R is other than an empty set and variable n is equal to or more than the threshold value, control goes to step 1106 in which an element is obtained from variable R (field set) and is stored in variable r, and then a field r is designated as a compression target. Control goes to step 1105 to execute judge processing for next variable (field reference set).

Through the above processing, the filed reference frequency in the program is predicted by automatically analyzing loops in the program. It is therefore possible to select as compression targets only data items for which it is predicted that the reference frequency is low.

Third Embodiment

When an object of the mixed format including the pointers 704 and 705 of the compressed format and the pointers 702 and 703 of the uncompressed format is used, there occurs a situation in which whether or not a field under consideration is compressed cannot be statically determined. For example, in most Java implementations, a program is executed by use of an interpreter or a code generated by a dynamic compiler.

In the code generating operation, the compiler can establish a one-to-one correspondence between the format of a field and a code which refers to the field. It is hence possible to statically determine the format of the pointer.

On the other hand, in the interpreter, it is required for one code to control operations to refer to a plurality of fields. It is hence necessary to dynamically determine the field format, which will be described later.

Figure 12:
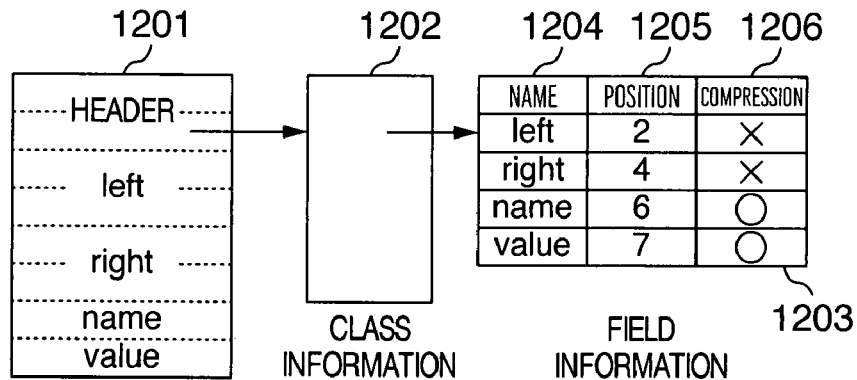
FIG. 12 is a diagram to explain an operation to determine the pointer compression format by use of field information.

FIG. 12 shows data structure employed when the format of compression is determined for the pointer according to field information 1203. The field information 1203 is obtained on the basis of class definitions and a judge result from the pointer reference frequency analyzer 102 (FIG. 1). An object 1201 represents data structure of a program and includes a pointer to information 1202 regarding a class to which the data belongs or information similar to the pointer. Via the information 1202, it is possible to refer to the field information 1203. Each entry of the field information 1203 includes a field name 1204, a field position 1205, and a flag 1206 indicating that the field has been compressed. It can be understood from the field information 1203 of FIG. 12 that a field at position 2 in the object 1201 is in the uncompressed format and a field at position 6 is in the compressed format.

Figure 17:
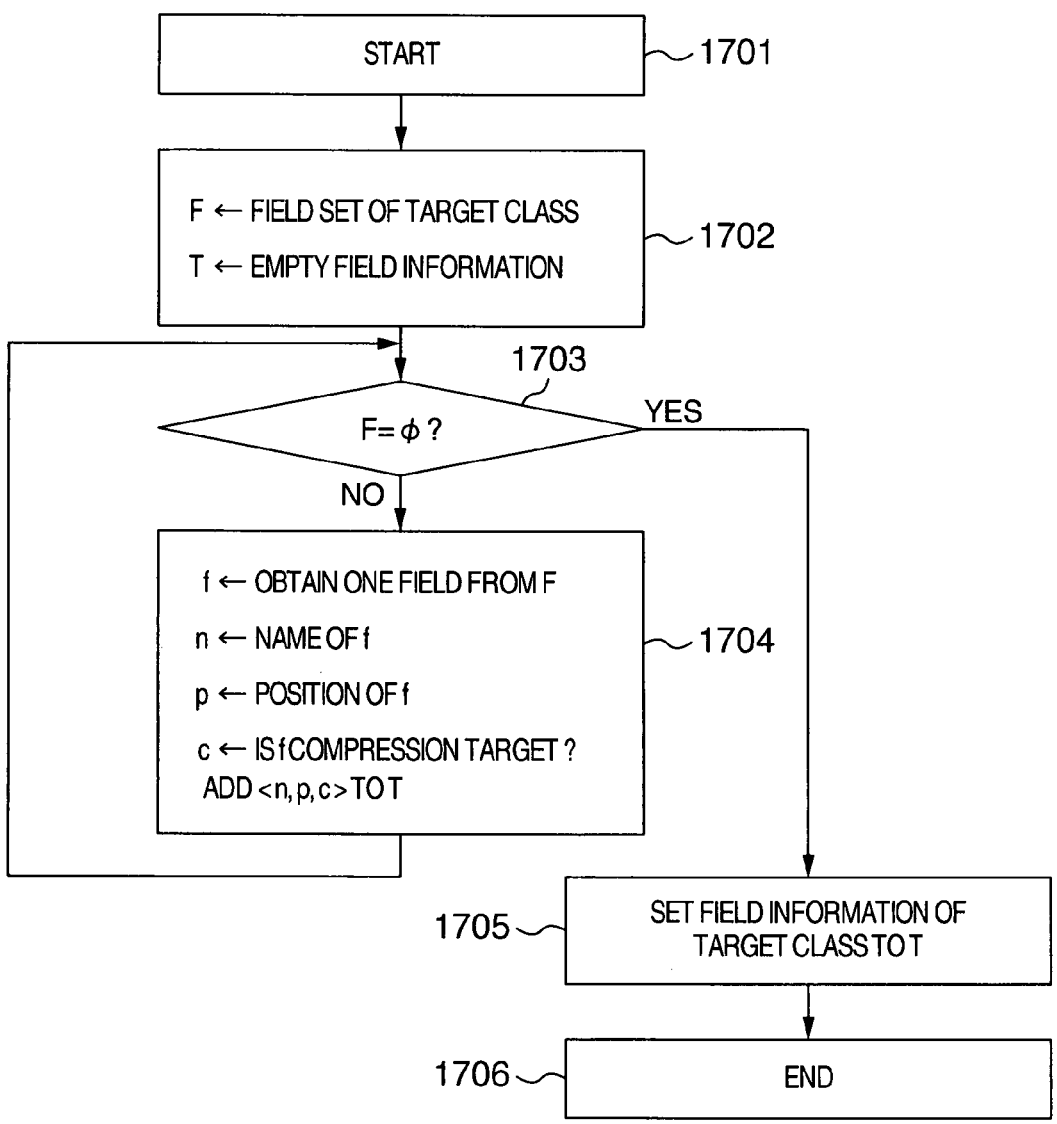
FIG. 17 is a flowchart of processing to create field information 1203.

FIG. 17 shows processing to generate the field information 1203 in a flowchart.

The processing starts in step 1701. In step 1702, a set of fields defined in a class for creation of the field information 1203 is represented as variable F. Variable T is initialized to empty field information. In judge step 1703, a check is made to determine whether or not the field set F thus obtained is an empty set. If F is an empty set, there does not exists a field to be processed. Control goes to step 1705 to designates field information of variable T as field information of the target class. If F is other than an empty set, control goes to step 1704. One of the fields is obtained from the set F and is stored in variable f. "Name of f", "position of f", and "whether or not f is a compression target" are stored in variables n, p, and c, respectively. Variable n, p, and c are added to the field information T. Control goes to step 1703 to process a next field.

Fourth Embodiment

In the method of the third embodiment to determine whether or not the pointer has been compressed, each time a field is referred to in the object 1201, it is required to make reference to the field information 1203, and hence the operation is not efficient. To improve the efficiency, information of "compressed" or "uncompressed" is saved in the pointer so that the discrimination therebetween is possible according to the pointer itself.

Figure 13A:
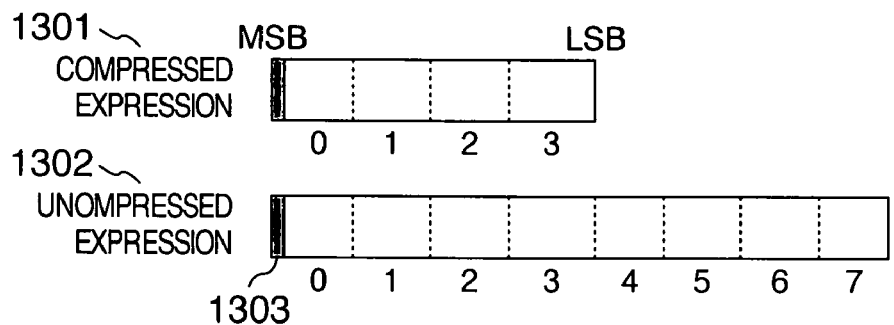
FIG. 13A is a diagram showing an example representing pointer compression according to a data representation of the program.
Figure 13B:
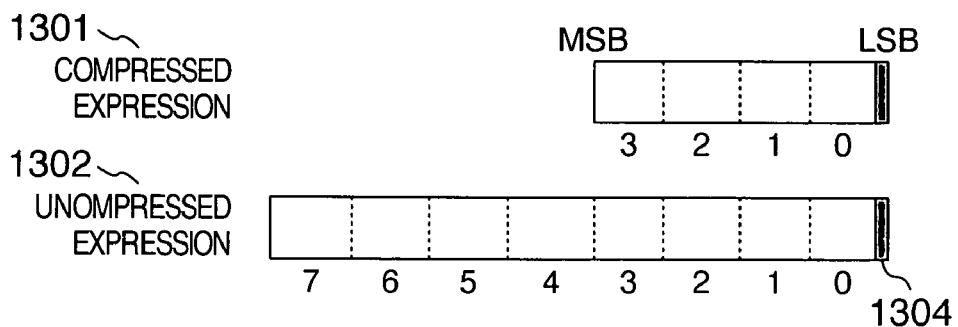
FIG. 13B is a diagram showing an example representing pointer compression according to a data representation of the program.

FIGS. 13A and 13B show examples representing compression of pointers included in data structure in the memory according to the data expression formats. Data items are expressed in (a) big-endian format or (b) little-endian format depending on the position of internal bytes of multi-byte data. In the big-endian format, the Most Significant Bit (MSB) of data is saved in a lower-most position of the address and the Least Significant Bit (LSB) is saved in a higher-most position of the address. In the little-endian format, the MSB of data is saved in a higher-most position of the address and the LSB is saved in a lower-most position of the address. Each of the pointers in the compressed format 1301 and the uncompressed format 1302 occupies a lower position of the address. Therefore, the information to identify the format of compression is allocated to a lower position of the address.

That is, in the big-endian format, the MSB 1303 of a byte allocated at the lower-most position of the address is used to identify the pointer format. In the little-endian format, the LSB 1304 of a byte allocated at the lower-most position of the address is used to identify the pointer format. In this situation, if the value of the pointer of the uncompressed format is other than an ordinary value, the overhead increases at execution of processing for the pointer. Therefore, the ordinary value is favorably used for the pointer value. In ordinary cases, the object allocation address is a multiple of eight, and hence the value of the LSB is zero in any situation.

Therefore, in the pointer expression of the pointer in the little-endian format, it is convenient that the value of the LSB of the compressed-type pointer is "1" and the value of the LSB of the uncompressed-type pointer is "0".

In the pointer expression of big-endian format, the value of the MSB of the uncompressed-type pointer depends on the address allocated to the heap memory area. Since the allocation address of the heap memory area depends on the memory allocation processing of the operating system (OS) and other programs, it is in general not easy to set a fixed value to the MSB. However, since the heap memory area is reserved as a continuous area, the MSB values can be arranged to have the same value in the area.

It is hence quite convenient to determine the MSB value as below. That is, (i) if the MSB of the heap memory allocation address is "0", "0" indicates a uncompressed-type pointer and "1" indicates a compressed-type pointer, and (ii) if the MSB of the heap memory allocation address is "1", "1" indicates a uncompressed-type pointer and "0" indicates a compressed-type pointer. In the case of (ii), since the uncompressed-type pointer matches the offset relative to the base address specifying the first position of the heap memory, there does not appear any disadvantageous overhead in the address calculation.

Figure 14:
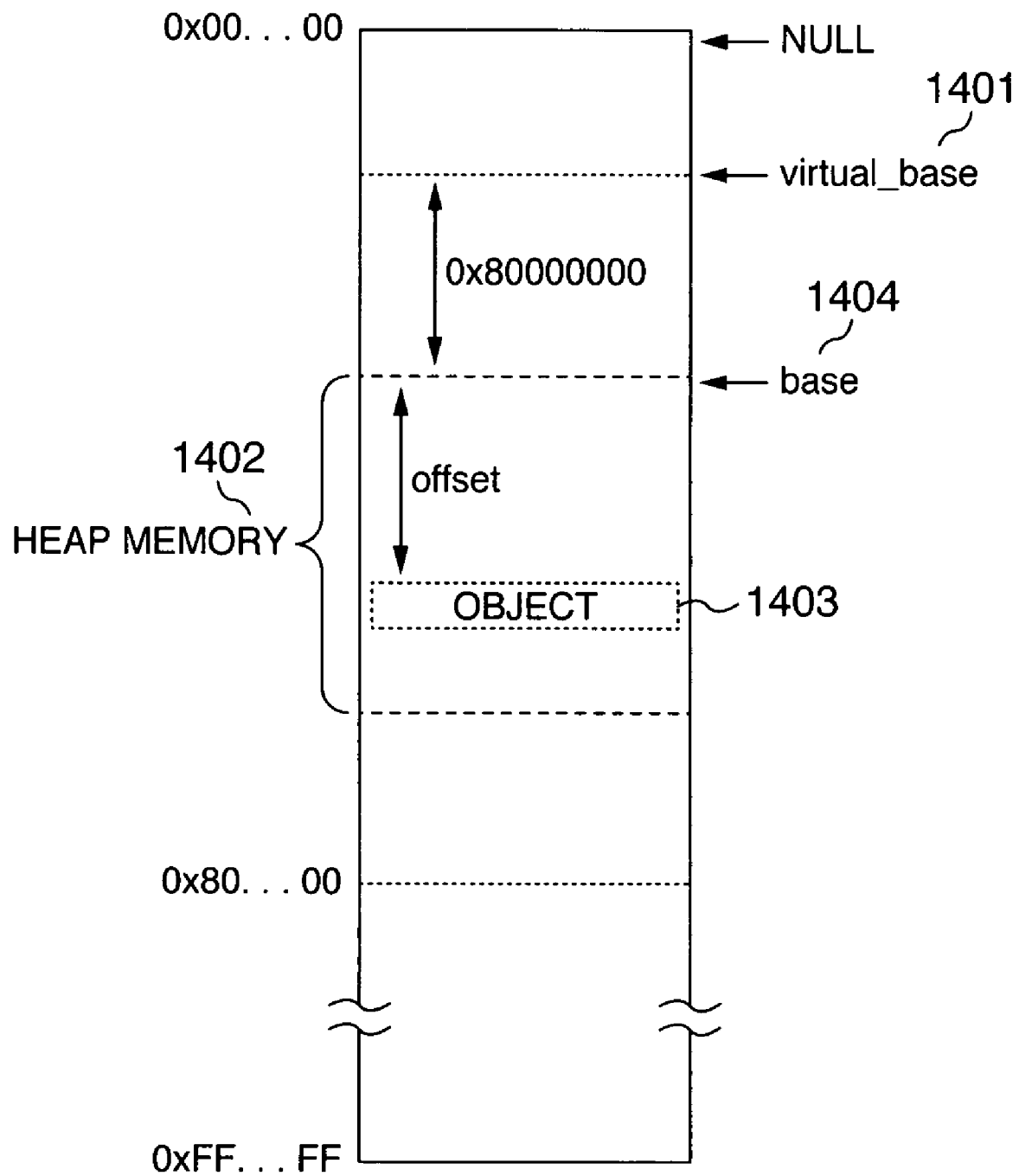
FIG. 14 is a diagram showing a layout of a memory space in a bid-endian computer system.

In the case of (i), there exists overhead to correct the MSB in the calculation of the offset value. The operation will be described by referring to FIG. 14. FIG. 14 shows a layout of the memory space in a bid-endian computer system. As can be seen from FIG. 14, it is desirable that as the base address to obtain the address of the object, there is not employed a base 1404 which is the first address of the heap memory, but there is used virtual-base 1401 which is an address lower than the base 1404 by 0x80000000. As a result, the MSB is corrected by the addition, which will be described below, in the address calculation to thereby obtain the address of the object 1403 (FIG. 14).

Specifically, it is assumed that the address of the base 1404 of the first address of the heap memory is 0x0000000080000000 in hexadecimal notation and the address of the object 1403 is 0x0000000080102030 in hexadecimal notation. The offset from the heap first address to the object 1403 is expressed as 0x00102030 using 32 bits. The MSB is set to "1" to indicate the compressed expression. The compressed pointer expression is then 0x80102030=0x80000000+0x00102030.

The value of the virtual_base 1401 is an address lower than the base 1404 by 0x80000000, that is, 0x0000000080000000−0x80000000=0x0000000000000000. Therefore, by adding the value of the virtual base to the compressed-type pointer with the MSB set to "1", the increase (0x80000000) in the value resultant from the operation to set the MSB to "1" is corrected to resultantly obtain the pointer value of 0x0000000080102030 for the object 1404.

In the example of FIG. 13, the pointer in the compressed expression is allocated to a field beginning at a position immediately following the fourth byte of the pointer in the uncompressed expression depending on cases. In this situation, the MSB of the compressed expression does not match the MSB of the uncompressed expression (not aligned with each other), and it is hence not possible to identify the pointer format on the basis of the MSB. However, the pointer is ordinarily allocated to an address which is a multiple of the data size. Therefore, if the pointer address is different from the address allocated in the uncompressed expression as above, it can be recognized that the pointer is in the compressed expression.

Figure 15:
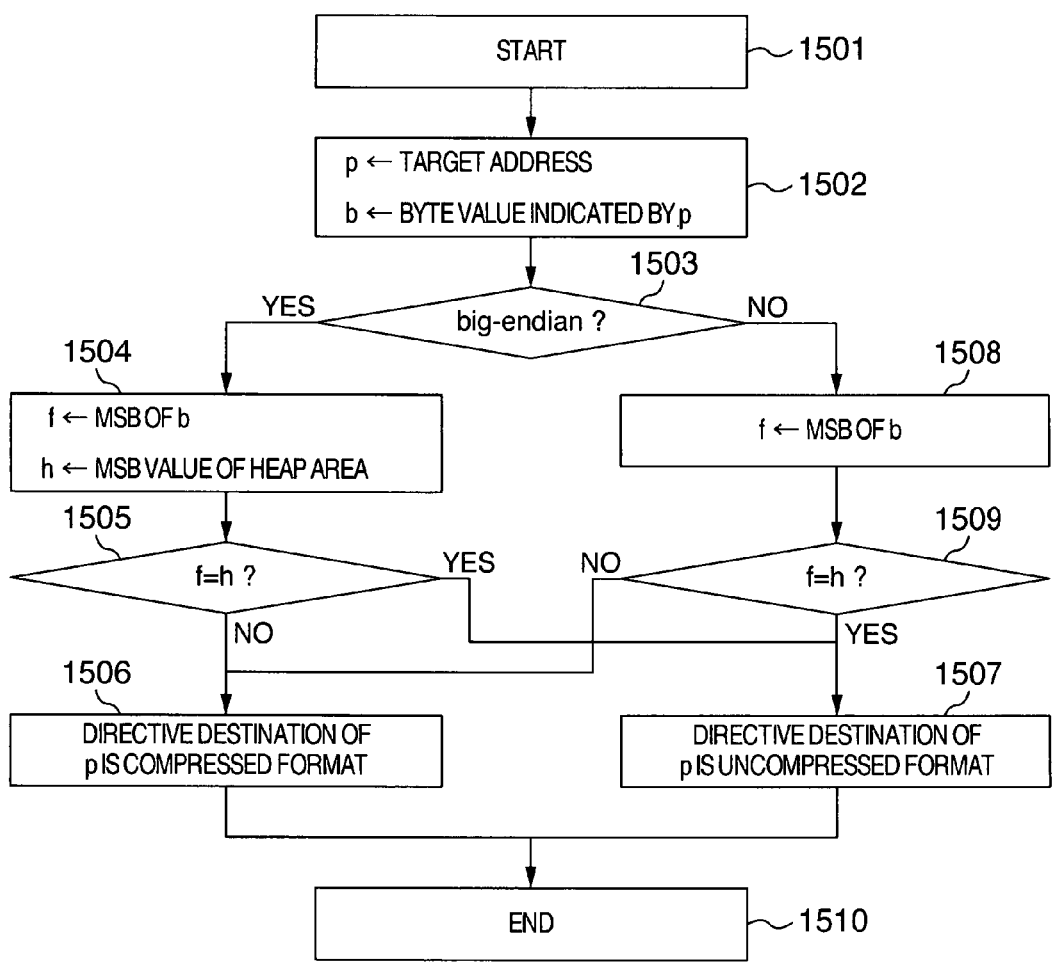
FIG. 15 is a flowchart of processing to identify the pointer compression type.

FIG. 15 shows, in a flowchart, processing to identify the pointer compressed format.

The processing starts in step 1501. In step 1502, according to the field of the pointer to be processed, an address stored in the field is stored in variable p and the byte value of an address designated by p is stored in variable b. In judge step 1503, a check is made to determine whether or not the computer system under consideration is using the big-endian format.

If the computer system is using the big-endian format, control goes to step 1504 in which the MSB value of variable b is stored in variable f and the value of the MSB of the address space to which the heap memory area is allocated is represented as variable h. In step 1505, a check is made to determine whether or not f is equal to h. If f is not equal to q, the pointer is in the compressed format. Control goes to step 1506 to determine that the pointer is in the compressed format. If f is equal to q, control goes to step 1507 to determine that the pointer is in the uncompressed format. Thereafter, control goes to step 1510 to terminate the processing.

If the computer system is not using the big-endian format in judge step 1503, control goes to step 1508 to store the LSB of variable b in variable f. In step 1509, a check is made to determine if the value of f is "0". If f is other than zero, control goes to step 1506 to determine that the pointer is in the compressed format. If f is zero, control goes to step 1507 to determine that the pointer is in the uncompressed format. Control then goes to step 1510 to terminate the processing.

As a result of the above processing, the format of the destination field specified by the pointer can be dynamically determined.

Figure 16:
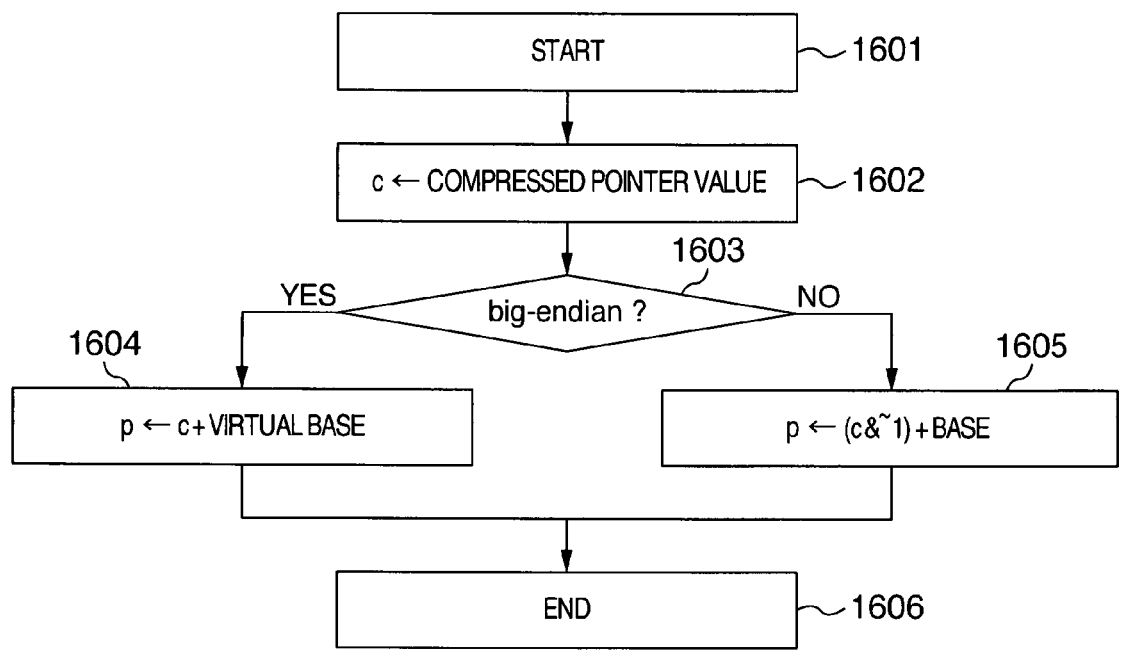
FIG. 16 is a flowchart of processing to convert a pointer of the compressed format into an actual address.

FIG. 16 is a flowchart of processing to convert a compressed format pointer into an actual address of data structure.

The conversion processing starts processing in step 1601. In step 1602, the compressed pointer value as the target of the processing is set to variable c. In step 1603, a check is made to determine whether or not the computer system is using the big-endian format. If the computer system is using the big-endian format, control goes to step 1604 in which an actual address of the pointer in the data structure is represented as variable p. Control goes to step 1606 to terminate the processing. As described above, the value of the virtual base 1401 (FIG. 14) is set to an address lower relative to the first address of the heap memory 1402 by the value (0x80000000) of the increase resultant from the setting of the MSB of the pointer in the compressed format 1301 (FIG. 13) to "1". Therefore, by adding the value of the virtual base 1401 to that of the pointer 1301, the increase due to the setting of the MSB to "1" is cancelled to resultantly obtain the actual address of the object 1403. If the computer system is not using the big-endian format, the value of variable c 1301 after clearing its LSB to zero is added to the value of the base address 1404 of the heap memory 1402 to obtain a result. The result is set to variable p as an actual address of the object indicated by the pointer in the data structure. Control goes to step 1606 to terminate the processing.

Through the processing described above, it is possible to obtain the actual address of the data structure according to the value of the compressed format pointer.

Fifth Embodiment

In the first embodiment, the reference frequency of fields in a program is predicted using the profile data 108 shown in FIG. 1. However, the prediction processing may also be achieved by analyzing directives embedded in or associated with the program.

Figures 18, 19:
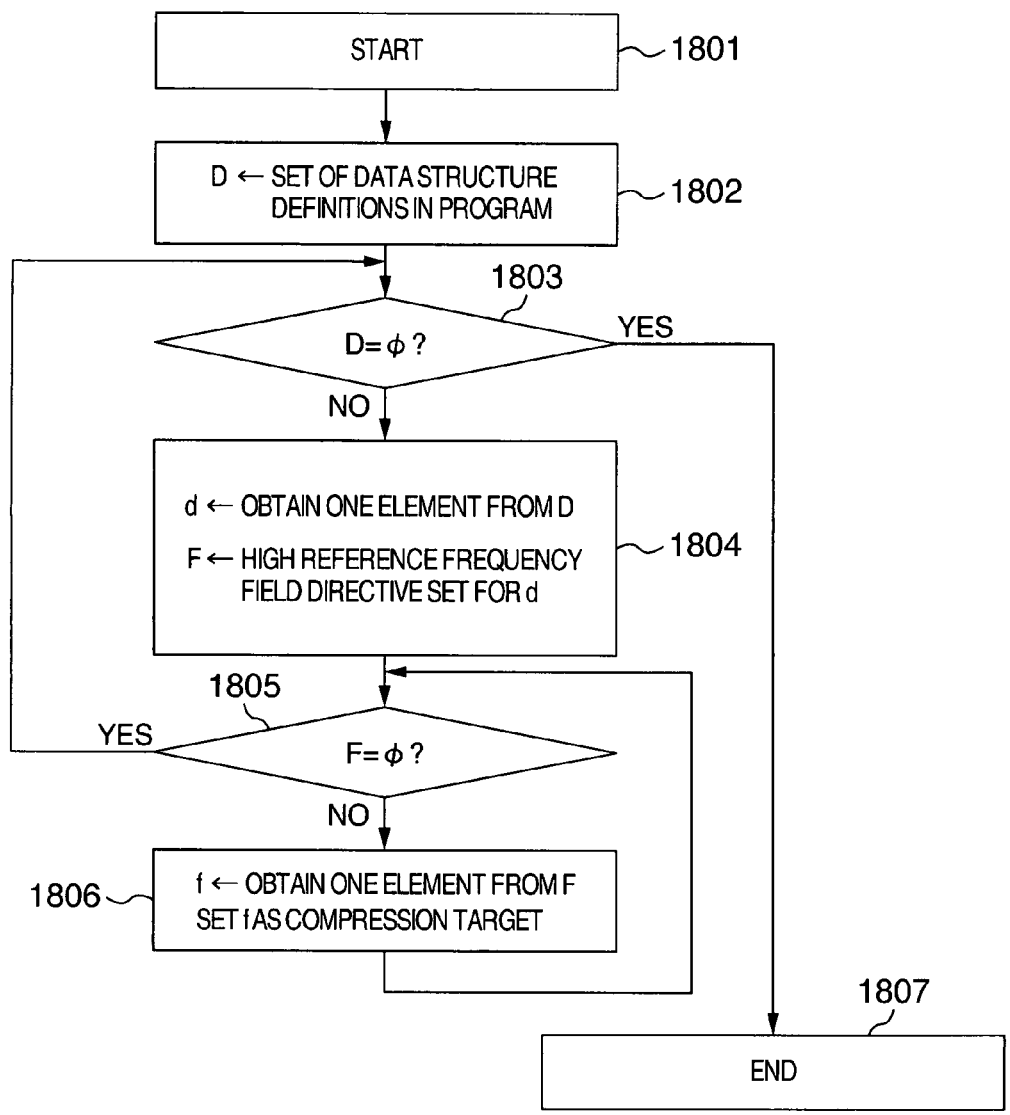
FIG. 18 is a flowchart of processing to implement pointer reference frequency analyzer 102.
FIG. 19 is an example of a directive to a program for a field reference frequency.

FIG. 19 shows an example of a directive of the field reference frequency for a program. In the example, a directive 1901 is added to the definition of data structure "Tree". This example indicates that among the fields defined in the data structure, fields "left" and "right" have a high reference frequency, the fields "left" and "right" are designated as uncompression targets, and the other fields are designated as compression targets.

FIG. 18 shows a flowchart of an example of implementation of the processing when the pointer reference frequency analyzer 102 of FIG. 1 is realized according to a user supplied directive. The processing of FIG. 18 starts processing in step 1801. In step 1802, a set of data structure definitions in the program is stored in variable D. In judge step 1803, a check is made to determine whether or not the set D is an empty set. If D is an empty set, there does not exist a definition to be processed. Control goes to step 1807 to terminate the processing. If D is other than an empty set, control goes to step 1804 in which one of the elements is obtained from the set D and is stored in variable d. A set of frequently referenced field specification directives designated for d is stored in variable F. In judge step 1805, a check is made to determine whether or not the set F is an empty set. If F is an empty set, there does not exists a field for the compression. Control goes to step 1803 to execute the next loop. If F is other than an empty set, control goes to step 1806 in which one of the elements is obtained from the set F and is stored in variable f. Moreover, the field f is designated as the compression target. Control goes to step 1805 to process a next field. As a result of the processing, by analyzing the directive from the user, it is possible to select as compression targets only data items for which it is predicted that the reference frequency is low.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A pointer field compression/expansion method for use in a computer system having a data structure reference function to make reference to data structure using a pointer, the computer system comprising a pointer reference frequency analyzer and a code generator section, comprising the steps of:

classifying, by the pointer reference frequency analyzer, pointer fields included in the data structure into pointer fields to be frequently referred to and those not to be frequently referred to, on the basis of a profile data generated using a result attained by pre-executing a program; and creating, by the code generator section according to a result of the classifying step, a pointer reference code for which compression processing is not conducted for each of the pointer fields to be frequently referred to, and a pointer reference code to which compression processing and expansion processing are applied for each of the pointer fields not to be frequently referred to.

2. A pointer field compression/expansion method according to claim 1, further comprising the step of allocating each of the pointers other than the pointers to be frequently referred to, to a position having offset relative to a base address.

3. A pointer field compression/expansion method according to claim 1, further comprising the step of expanding the pointer field by use of field information beforehand created.

4. A pointer field compression/expansion method according to claim 1, wherein the program or the computer system uses a data expression in a big-endian format, the method further comprising the step of expanding the pointer field if a Most Significant Bit (MSB) of a pointer associated with the pointer field includes a bit indicating that the pointer is in an compressed format.

5. A pointer field compression/expansion method according to claim 1, wherein the program or the computer system uses a data expression in a little-endian format, the method further comprising the step of expanding the pointer field if a Least Significant Bit (LSB) of a pointer associated with the pointer field includes a bit indicating that the pointer is in a compressed format.

6. A pointer field compression/expansion method according to claim 4, wherein the step of expanding the pointer field comprises shifting a base address employed to convert a pointer in the compressed format into a pointer in an uncompressed format, by a value of the MSB.

7. A pointer field compression/expansion method for use in a computer system having a data structure reference function to make reference to data structure using a pointer, the computer system comprising a pointer reference frequency analyzer and a code generator section, comprising the steps of:

classifying, by the pointer reference frequency analyzer, pointer fields included in the data structure into pointer fields to be frequently referred to and those not to be frequently referred to, on the basis of a result of a structure analysis of a program; and creating, by the code generator section according to a result of the classifying step, a pointer reference code for which compression processing is not conducted for each of the pointer fields to be frequently referred to and a pointer reference code to which compression processing and expansion processing are applied for each of the pointer fields not to be frequently referred to.

8. A pointer field compression/expansion method for use in a computer system having a data structure reference function to make reference to data structure using a pointer, the computer system comprising a pointer reference frequency analyzer and a code generator section, comprising the steps of:

classifying, by the pointer reference frequency analyzer, pointer fields included in the data structure into pointer fields to be frequently referred to and those not to be frequently referred to, on the basis of a directive designated in a program or supplied to a program; and creating, by the code generator section according to a result of the classifying step, a pointer reference code for which compression processing is not conducted for each of the pointer fields to be frequently referred to and a pointer reference code to which compression processing and expansion processing are applied for each of the pointer fields not to be frequently referred to.

9. A computer-readable medium storing a pointer field compression/expansion program for causing a computer system which has a data structure reference function to make reference to data structure using a pointer, to function as:

a pointer reference frequency analyzer for classifying pointer fields included in the data structure into pointer fields to be frequently referred to and those not to be frequently referred to, on the basis of a program file generated using a result attained by pre-executing a program; and a code generator section for creating, according to a result of the classifying operation, a pointer reference code for which compression processing is not conducted for each of the pointer fields to be frequently referred to and a pointer reference code to which compression processing and expansion processing are applied for each of the pointer fields not to be frequently referred to.

* * * * *